(12) United States Patent
Périn et al.

(10) Patent No.: US 11,489,532 B2
(45) Date of Patent: Nov. 1, 2022

(54) ANALOG PHASE LOCKED LOOP

(71) Applicant: NXP B.V., Eindhoven (NL)

(72) Inventors: Mathieu Périn, Cairon (FR); Stefano Dal Toso, Antibes (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/241,578

(22) Filed: Apr. 27, 2021

(65) Prior Publication Data
US 2022/0263512 A1 Aug. 18, 2022

(30) Foreign Application Priority Data
Feb. 12, 2021 (EP) .................................. 21305185

(51) Int. Cl.
*H03L 7/099* (2006.01)
*H03L 7/097* (2006.01)
*H03L 7/093* (2006.01)

(52) U.S. Cl.
CPC ............ *H03L 7/0992* (2013.01); *H03L 7/093* (2013.01); *H03L 7/097* (2013.01)

(58) Field of Classification Search
CPC ......... H03L 7/085; H03L 7/093; H03L 7/097; H03L 7/0992; H03L 7/0993
See application file for complete search history.

(56) References Cited

U.S. PATENT DOCUMENTS

2003/0203720 A1* 10/2003 Oosawa .................. H03L 7/107
455/84
2019/0334530 A1* 10/2019 Gupta ..................... H03L 7/085

OTHER PUBLICATIONS

Sun, Yuanfeng et al; "A 2.74-5.37GHz Boosted-Gain Type-I PLL with <15% Loop Filter Area"; IEEE Radio Frequency Integrated Circuits Symposium; 4 pages (2012).
Zhang, Zhuo et al; "A Wide-Tuning Quasi-Type-I PLL with Voltage-Mode Frequency Acquisition Aid"; IEEE Intl Symposium of Circuits and Systems; 4 pages (2011).
Golestan, Saed; "A Quasi-Type-I Phase-Locked Loop Structure"; IEEE Trans. on Power Electronics, vol. 29, Issue 12; 7 pages (Dec. 2014).

* cited by examiner

*Primary Examiner* — Diana J. Cheng

(57) ABSTRACT

An analog PLL comprising: a VCO configured to provide a PLL output signal; a phase detector (PD) configured to receive a feedback signal from the VCO and a reference signal and wherein the PD provides a PD signal to a low pass filter (LPF), the LPF configured to filter of the PD signal and provide the filtered signal as a tuning voltage for the VCO; and a tracking loop configured to receive the tuning voltage and comprising at least a tracking loop comparator configured to provide a comparator output voltage based on a difference between the tuning voltage and a target voltage, wherein an output of the tracking loop provides a tracking voltage based on the comparator output voltage and wherein the frequency of the PLL output voltage is based on the tuning voltage and the tracking voltage.

17 Claims, 3 Drawing Sheets

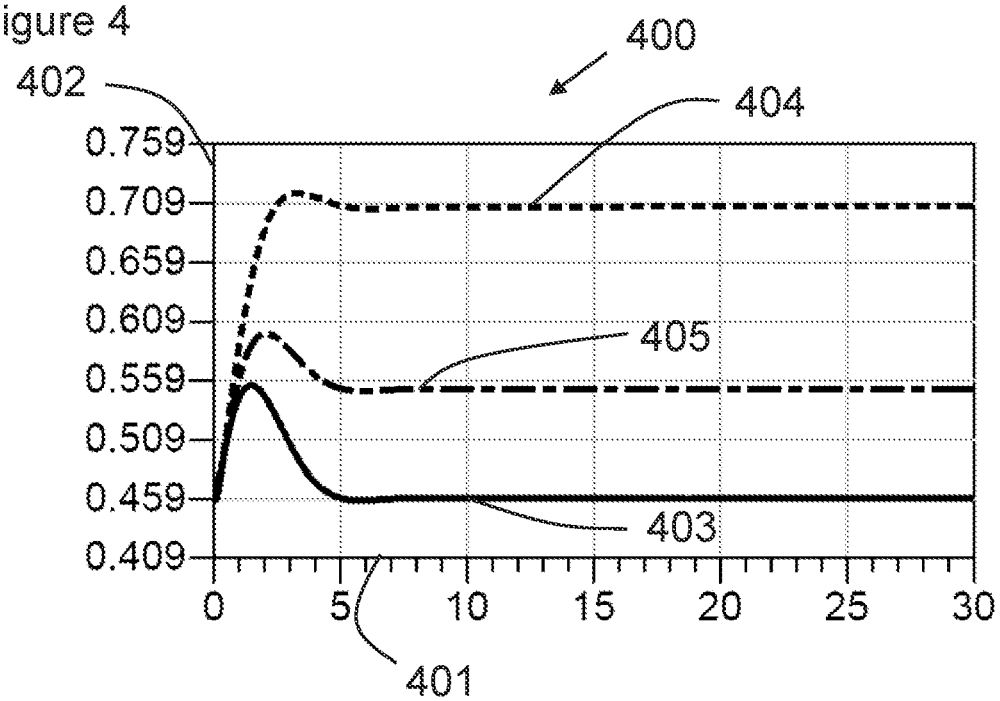
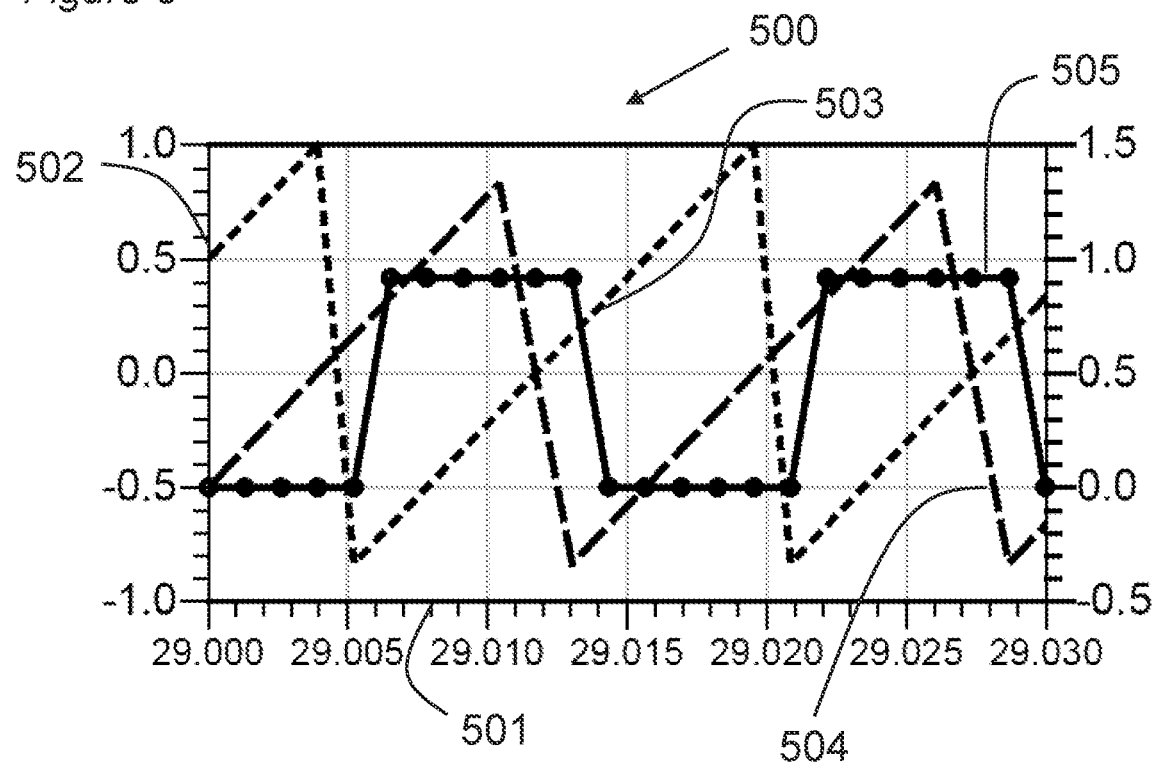

ANALOG PHASE LOCKED LOOP

CROSS-REFERENCE TO RELATED APPLICATIONS

This application claims the priority under 35 U.S.C. § 119 of European patent application no. 21305185.7, filed Feb. 12, 2021 the contents of which are incorporated by reference herein.

FIELD

The present disclosure relates to an analog phase locked loop (PLL). More particularly, the present disclosure relates to an analog PLL comprising a tracking loop that can selectively operate in one of a plurality of modes.

SUMMARY

According to a first aspect of the present disclosure there is provided an analog phase locked loop (PLL) comprising:
- a voltage controlled oscillator, VCO, configured to provide, at a PLL output, a PLL output signal comprising an alternating current, AC, signal;
- a phase detector coupled to the output of the VCO, the phase detector configured to receive a feedback signal at a first phase detector input and a reference signal at a second phase detector input, wherein the feedback signal is based on the PLL output signal and wherein the phase detector is configured to provide a phase detector signal at an output of the phase detector based on a determination of the phase difference between the feedback signal and the reference signal;
- a low pass filter configured to receive the phase detector signal from the phase detector, the low pass filter configured to provide for filtering of the phase detector signal and provide the filtered signal as an output, wherein said output of the low pass filter is a tuning voltage for the VCO; and
- a tracking loop configured to receive the tuning voltage at an input of the tracking loop and comprising at least a tracking loop comparator configured to provide a comparator output voltage based on a difference between the tuning voltage and a target voltage, wherein an output of the tracking loop provides a tracking voltage based on the comparator output voltage and wherein the frequency of the PLL output voltage is based on the tuning voltage and the tracking voltage; and
- wherein the phase detector is thereby configured to control the phase detector signal that, in park, controls the VCO to reduce the phase difference between the feedback signal and the reference signal and the tracking loop is thereby configured to control the tracking voltage that, in part, controls the VCO to control the PLL output signal which, through the phase detector, acts to reduce the difference between the tuning voltage and the target voltage.

In one or more embodiments, the tracking loop may further comprise an integrator configured to receive the comparator output voltage at an input of the integrator and provide a non-zero output signal both where there is a difference between the tuning and tracking voltages received at the inputs of the tracking loop comparator and where there is no difference between the tuning and tracking voltages received at the inputs of the tracking loop comparator. In one or more embodiments, the integrator output signal may be the tracking voltage. In one or more other embodiments, further processing may be applied to the time-averaged integrator output voltage to generate the tracking voltage.

In one or more embodiments, the tracking loop may comprise a proportional integral controller, PIC, configured to receive the comparator output voltage at an input of the integrator and provide a non-zero PIC output signal both where there is a difference between the tuning and tracking voltages received at the inputs of the tracking loop comparator and where there is no difference between the tuning and tracking voltages received at the inputs of the tracking loop comparator, wherein the tracking voltage is based on the PIC output signal.

In one or more embodiments, the tracking loop may comprise a proportional integral derivative controller, PIDC, configured to receive the comparator output voltage an input of the integrator and provide a non-zero PIDC output signal both where there is a difference between the tuning and tracking voltages received at the inputs of the tracking loop comparator and where there is no difference between the tuning and tracking voltages received at the inputs of the tracking loop comparator, wherein the tracking voltage is based on the time-averaged PIDC output signal.

In one or more embodiments, the tracking loop comparator may be an analog tracking loop comparator configured to provide an analog comparator output signal to a digital controller, the digital controller comprising the integrator and the digital controller configured to provide a digital controller output signal to a digital to analog converter configured to convert the digital controller output signal to an analog signal, wherein the analog signal is the tracking voltage.

In one or more embodiments, the target voltage may be a programmable voltage and wherein adjustment of the target voltage provides for adjustment of the phase difference between the reference signal and the feedback signal.

In one or more embodiments, the VCO may comprise a tuning input configured to receive the tuning voltage and a tracking input configured to receive the tracking voltage.

In one or more embodiments, the VCO may be configured to apply a tracking gain to the received tracking voltage and the VCO is configured to apply a tuning gain to the tuning voltage and wherein the tracking gain is related to the tuning gain such that, if the tracking gain is equal to a factor X, then the tuning gain is equal to a factor of 1−X where $0 \leq X \leq 1$.

In one or more embodiments, the phase locked loop may further comprise a summing element configured to receive the tracking voltage at a first summing input and the tuning voltage at a second summing input, wherein the summing element comprises a summing output configured to provide a summed output signal based on the sum of the tracking voltage and the tuning voltage and wherein the frequency of the PLL output signal of the VCO is based on the summed output signal.

In one or more embodiments, wherein the VCO is configured to apply a tracking gain to the received tracking voltage and the VCO is configured to apply a tuning gain to the tuning voltage and wherein the tracking gain is related to the tuning gain such that, if the tracking gain is equal to a factor $K_{VCO}*X$, then the tuning gain is equal to a factor of $K_{VCO}*(1-X)$ where $0 \leq X \leq 1$ and where $K_{VCO}$ is a scaling constant real number expressed in Hz/V. It will be appreciated that, if X is equal to 0, then type-I operation is achieved. If 0<X<1, then partial tracking quasi-type-II operation is achieved and if X is equal to 1, full tracking quasi-type-II operation is achieved.

In one or more embodiments, the tracking loop may comprise one or both of:

a first tracking loop switch configured to switchably couple and decouple the tracking loop from the tuning voltage; and a second tracking loop switch configured to switchably couple and decouple the tracking loop from the VCO.

In one or more embodiments, a feedback divider may be coupled to the output of the VCO, wherein the frequency divider is configured to receive the PLL output signal at an input of the feedback divider and to provide the feedback signal at an output of the feedback divider which has a frequency equal to the frequency of the PLL output signal divided by a number not equal to 1.

In one or more embodiments, the analog PLL may further comprise a pre-charge switch which is configured to switchably couple the input of the low pass filter to one of:

the output of the phase detector; and a pre-charge voltage node couplable to a pre-charge voltage wherein, when the pre-charge switch is coupled to the pre-charge voltage via the pre-charge voltage node, the provision of the pre-charge voltage to the VCO via the low pass filter causes the VCO to approach a target frequency.

In one or more embodiments, the pre-charge voltage may be equal to the target voltage of the tracking loop.

In one or more embodiments, the pre-charge voltage and the target voltage may be set by a voltage divider arrangement arranged between a first reference voltage and a second reference voltage.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which:

FIG. 4 shows example simulated data showing how the tuning voltage, tracking voltage and weighted sum of the tuning and tracking voltages vary over time during locking of the PLL in the case where a VCO error is present;

FIG. 5 example simulated data showing how the phase detector signal varies over time in response to the feedback voltage and the reference voltage in the case where a VCO error is present.

DETAILED DESCRIPTION

A phase locked loop is a device which is configured to provide an output signal having a frequency defined by a reference signal at its input and then to lock to that frequency. Locking to a frequency is achieved by way of a phase detector which detects a phase difference between a reference signal and a feedback signal and uses changes in the phase difference to maintain the output frequency.

PLLs can be Type I PLLs, Type II PLLs or even Type N PLLs where N represents the number of integrators in the loop. In general terms, Type I PLLs differ from Type II PLLs by their absence of an additional integrator in the system other than the voltage controlled oscillator. The main effect of the lack of additional integrators is a variable phase error between the phase detector reference and feedback signals. On the other hand, this limitation comes with several advantages including: faster locking time; better phase noise vs power trade-off, and smaller PLL area. Nevertheless, there are some applications where a PLL with variable phase error cannot be used, thereby excluding the possibility of using a Type I PLL, despite its advantages. Where there is a frequency error, i.e. an offset, in the output frequency of the VCO as compared to its expected output frequency, the phase difference between a reference signal and a feedback signal in the PLL will change and, consequently, so will the duty cycle of the phase detector output signal. In some systems, a change in the phase difference may not be desirable.

Figure 1:
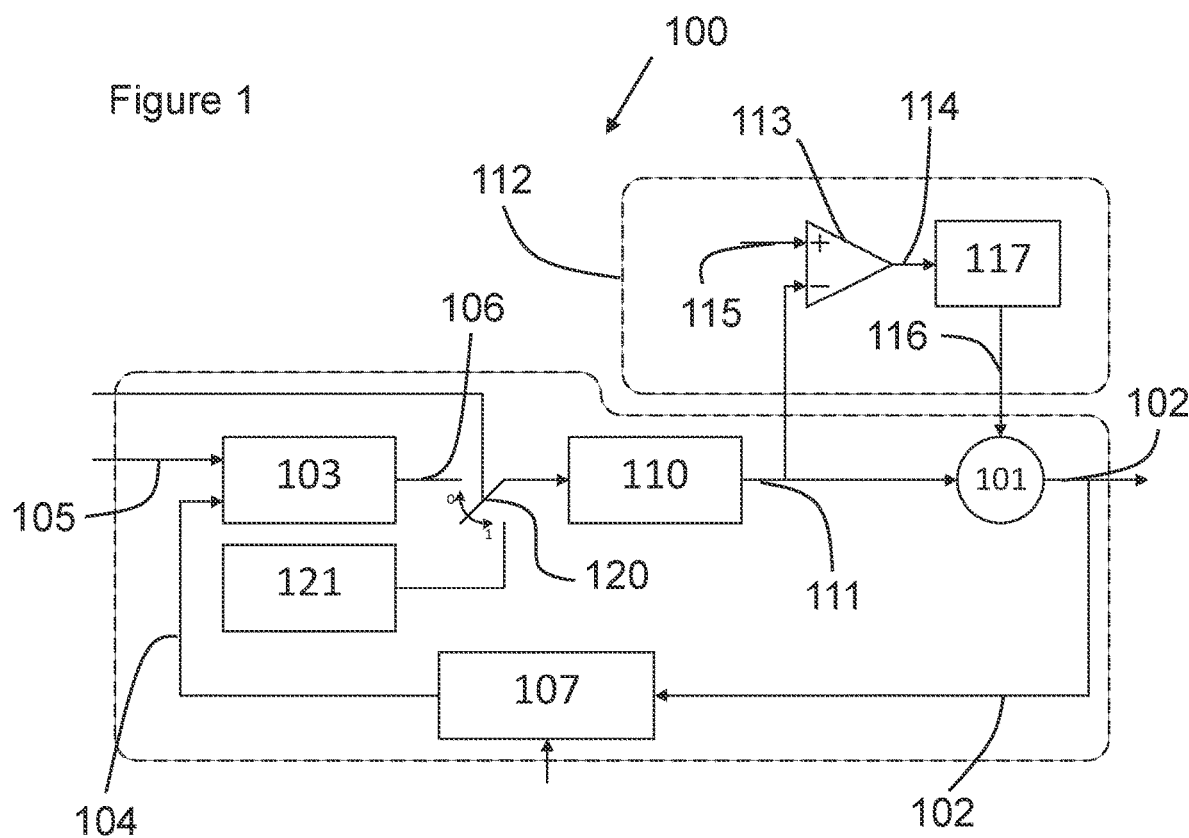
FIG. 1 shows an example embodiment of an analog PLL according to the present disclosure.

FIG. 1 shows an example analog PLL 100 according to the present disclosure. The present disclosure may be particularly relevant to analog PLLs.

The analog phase locked loop 100 comprises a voltage controlled oscillator (VCO) 101 configured to provide, at a PLL output, a PLL output signal 102 comprising an alternating signal wherein the frequency of the PLL output signal 102 is based on the voltage of one or more signals provided at one or more inputs of the VCO 101. In one or more embodiments, the VCO 101 may comprise a single input terminal which is configured to receive a control signal on which the frequency of the PLL output signal will be based. In particular, in these embodiments, the frequency of the PLL output signal 102 is based on the voltage of the signal at the single input terminal. In other embodiments, the VCO 101 may comprise at least two input terminals where the PLL output signal 102 frequency is based on the voltage of the signals received at each of the input terminals. The voltages received by the VCO 101 and how the frequency is based on these signals is described in more detail below.

The analog PLL 100 further comprises a phase detector 103 coupled to the output of the VCO 101 wherein the phase detector is configured to receive a feedback signal 104 at a first phase detector input and a reference signal 105 at a second phase detector input. The feedback signal is based on the PLL output signal 102 and may be received directly from the output of the VCO 101 or another electronic component may operate on the PLL output signal 102 in order to provide the feedback signal 104. The reference signal 105 comprises a fixed-frequency reference signal which may be generated in any suitable way such as by a signal generator, a crystal oscillator, another PLL or any other clock or periodic signal generator. The phase detector 103 is configured to provide a phase detector signal 106 at an output of the phase detector 103 wherein the voltage of the phase detector signal 106 is based on the phase difference between the reference signal 105 and the feedback signal 104. In this way, if the frequency of the PLL output signal 102 varies, due to VCO error, for example, the frequency of the feedback signal 104 will change and, as such, the voltage of the phase detector signal 106 will change. The change in the phase detector output signal 106 will work to counteract the frequency variation of the VCO 101 and thereby locking of the PLL output signal 102 frequency is achieved. The phase detector 103 may provide a substantially square-wave phase detector output signal 106 where the duty cycle of the square wave is dependent on the phase difference between the reference signal and the feedback signal. In some embodiments, it may be desirable to operate in a mode where the duty cycle is 50% which may correspond to a phase difference of −180 degrees, for example.

In one or more embodiments, the PLL 100 may comprise a frequency divider 107 coupled to the output of the VCO 101 such that the frequency divider 107 receives the PLL output signal 102 at an input terminal. The frequency divider 107 may be configured to provide a feedback signal as at its output wherein the feedback signal has a frequency equal to the frequency of the PLL output signal 102 divided by an integer value which is greater than 1. It will be appreciated that a division equal to one would be no division at all, thereby providing the reason for the requirement that the division is an integer not equal to one. In other embodiments, the frequency divider 107 may alternatively be configured to divide by a non-integer value. In such embodiments, the frequency divider is arranged between the output of the VCO and the phase detector. The addition of a frequency divider 107 allows for a lower frequency reference signal 105 to be used which may provide for one or more advantages such as: using cheaper components, having an improved stability reference signal or taking up a smaller surface area. In other embodiments, a frequency divider 107 may not be present and the feedback signal 104 may be the PLL output signal 102 with no further processing applied to it by additional components. In one or more applications, a frequency divider 107 may be mandatory while in other embodiments, it may be an optional feature. For example, where the PLL 100 is configured to generate a programmable frequency from a fixed reference signal, a frequency divider may be necessary. Or, in other embodiments, the PLL 100 may be configured to generate a fixed output frequency based on one or more multiple or variable reference frequencies.

The PLL 100 further comprises a low pass filter 110 configured to receive the phase detector signal 106 from the phase detector 103. The low pass filter 110 is configured to provide for filtering of the phase detector signal 106 and provide the filtered signal as an output wherein the output of the low pass filter 110 is a tuning voltage 111. It will be understood that a low pass filter 110 provides for the filtering of high frequency signal components while allowing low frequency components to pass either without any attenuation or with very little attenuation. In some examples, this may remove a jitter or high-frequency noise signal that may be found on the phase detector signal. In this way, the low pass filter 110 may be configured to convert the pulsed signal received at its input to an average voltage signal at its output. The DC tuning voltage 111 may be equal to the duty cycle of the received phase detector signal 106 multiplied by a supply voltage of the PLL 100.

The analog PLL 100 further comprises a tracking loop 112 configured to receive the tuning voltage 111 at an input of the tracking loop 112. The tracking loop 112 comprises at least a tracking loop comparator 113 configured to provide a comparator output voltage 114 based on a difference between the tuning voltage 111 and a target voltage 115, the target voltage 115 received at a second input of the tracking loop comparator 113. In one or more embodiments, the target voltage 115 may be set to a voltage that, if provided to the VCO 101 under ideal conditions would provide the desired output frequency. However, the output frequency of a VCO is not highly stable over time and, instead, the output frequency of the VCO will drift over time. It is for this reason that the feedback loop and, in this case, the tracking loop 112 are provided in order to correct for that frequency drift. In the absence of the tracking loop 112, the main loop would have to compensate for frequency drift, resulting in phase error variation inherent to Type-I operation. The tracking loop 112 allows for the tuning voltage 111 to be compared to the target voltage 115 and, if there is a difference between the target voltage 115 and the tuning voltage 111, then the tracking loop comparator 113 provides a non-zero comparator output voltage 114. In one or more examples, where there are no additional components in the tracking loop 112, the comparator output voltage 114 is the tracking voltage 116. In one or more other embodiments, the tracking loop 112 may comprise one or more additional electronic components which may act on the comparator output voltage 114 in order to provide the tracking voltage 116. Additional electronic components which may be included in the tracking loop 112 are discussed in more detail below.

In one or more embodiments, the tracking loop 112 may further comprise an integrator 117. The integrator 117 may be configured to receive the comparator output voltage 114 at an input of the integrator 117 and provide a time-averaged integrator output signal. That is, the integrator 117 may be configured to perform a time integration of the voltage received at its input, thereby allowing to generate a non-zero output signal even in presence of a zero error between the two comparator input signals. In one or more embodiments, the integrator 117 may be considered as an analog memory wherein, once the tracking loop comparator input voltage error reaches 0, the integrator 117 may hold its output voltage, thereby providing a non-zero output signal. In one or more embodiments, the integrator output signal may be the tracking voltage 116. In other embodiments, further processing by additional electronic components may be applied to integrator output voltage to generate the tracking voltage 116. In one or more embodiments, the integrator 117 may be an analog integrator 117.

In one or more embodiments, the tracking loop 112 further comprises an analog proportional integral controller (PIC) and the integrator 117 may form part of the PIC. In one or more other embodiments, the tracking loop may comprise an analog proportional integral derivative controller (PIDC) and the integrator 117 may form part of the PIDC. A PIC or PIDC may provide for speeding up of the tracking loop convergence, and therefore quicker frequency lock than only using an integrator 117 or using no integrator 117 at all. The provision of a PIC in the tracking loop 112 may provide for a way to combine both the comparator function and the integrator function with a single operational amplifier. The PIC may further provide flexibility in terms of the loop stability control, as a zero in the system can be introduced that can be controlled in terms of frequency placement. A PIDC may provide for a faster system, as the additional of a derivator in parallel may counteract the slowness of the integrator 117.

In yet other embodiments, the tracking loop 112 may comprise a digital controller and a digital to analog converter. The digital controller may comprise an analog to digital converter configured to convert the comparator output signal to a digital signal. The digitised signal may be provided to a digital accumulator that will act as the integrator 117. The integrated output signal may subsequently be provided to the digital to analog converter in order to provide the tracking voltage. The accumulator may have a programmable gain and the digitised signal may be provided to a low pass digital filter or a moving average engine to create a proportional path. As such, both the accumulator output and the filter output can be weight-summed to provide the signal which is input into the digital to analog converter.

The PLL output signal 102 is based on the tuning voltage 111 and the tracking voltage 117. In one or more embodiments, the VCO 101 may comprise a tuning input configured to receive the tuning voltage 111 from the low pass filter and tracking input configured to receive the tracking voltage 116 from the tracking loop 112. In such embodiments, the frequency of the PLL output signal 102 is based on both the tracking voltage 116 and the tuning voltage 111 received by the VCO 101. The VCO 101 may be configured to apply a tracking gain to the received tracking voltage 116. The tracking gain may be a multiplicative factor applied to the tracking voltage 116 in order to control the degree to which the frequency of the PLL output signal is influenced by the tracking voltage 116. The VCO may further be configured to apply a tuning gain to the received tuning voltage 111. The tuning gain may be a multiplicative factor applied to the tuning voltage 111 in order to control the degree to which the frequency of the PLL output signal is influenced by the tuning voltage 111. The tracking gain and the tuning gain may be interrelated. For example, if the tracking gain is set to be equal to a multiplicative factor X, then the tuning gain may be set to be equal to a multiplicative factor of 1−X where 0≤X≤1. It will be appreciated that this provides for scaling of the influence of the two voltages 111, 116 on the frequency of the PLL output signal 102. Each of the factors X and 1−X may be multiplied by a gain constant $K_{VCO}$ wherein the factors X and 1−X provide for a management of the weighting of the impact each signal has on the PLL output signal 102 frequency and the gain factor $K_{VCO}$ scales the summed gain by a desired amount. The gain factor $K_{VCO}$ may be expressed in units of Hz/V and is a real number. In particular, where the multiplicative factor X is equal to zero, then the tracking loop 112, and thereby the tracking voltage 116 has no impact, or substantially no impact, on the frequency of the PLL output signal 102 and, as such, the PLL 100 will operate as a Type 1 PLL. Conversely, where the multiplicative factor X is set to 1 the PLL may operate in a full tracking quasi-type-II mode of operation wherein the tracking voltage provides for full control of the frequency of the PLL output signal. In this example, X may take on non-integer values. It will be appreciated that, in such cases, this will provide different levels of tuning between the two extreme cases of setting X equal to either zero or one. It will be appreciated that the gain factors may be implemented in ways other than described herein in order to provide for adjustment of the impact of each of the tracking voltage 116 and the tuning voltage 111 on the frequency of the VCO output signal 102.

In one or more embodiments, the analog PLL 100 may comprise a summing element configured to receive the tuning voltage at a first summing input from the low pass filter 110. The summing element may also be configured to receive the tracking voltage 116 at a second summing input from the tracking loop 112. The summing element may further comprise a summing output configured to provide a summed output signal based on the sum of the tracking voltage 116 and the tuning voltage 111 and the summed output signal is provided to an input of the VCO 101. In such embodiments, the frequency of the PLL output signal 102 is based on both the tracking voltage 116 and the tuning voltage 111 received by the VCO 101. The summing element may be configured to apply a tracking gain to the received tracking voltage 116. The tracking gain may be a multiplicative factor applied to the tracking voltage 116 in order to control the degree to which the frequency of the PLL output signal 102 is influenced by the tracking voltage 116. The VCO 101 may further be configured to apply a tuning gain to the received tuning voltage 111. The tuning gain may be a multiplicative factor applied to the tuning voltage 111 in order to control the degree to which the frequency of the PLL output signal 102 is influenced by the tuning voltage 111. The tracking gain and the tuning gain may be interrelated. For example, if the tracking gain is set to be equal to a multiplicative factor X, then the tuning gain may be set to be equal to a multiplicative factor of 1−X where 0≤X≤1. It will be appreciated that this provides for scaling of the influence of the two voltages 111, 116 on summed output voltage and, thereby, on the frequency of the PLL output signal 102. Each of the factors X and 1−X may be multiplied by a gain constant $K_{VCO}$ wherein the factors X and 1−X provide for a management of the weighting of the impact each signal has on the VCO output signal frequency and the gain factor $K_{VCO}$ scales the summed gain by a desired amount. The gain factor $K_{VCO}$ may be expressed in units of Hz/V and is a real number. In particular, where the multiplicative factor X is equal to zero, then the tracking loop 112, and thereby the tracking voltage 116 has no impact, or substantially no impact, on the frequency of the PLL output signal 102 and, as such, the PLL 100 will operate as a Type 1 PLL. Conversely, where the multiplicative factor X is set to 1 the PLL 100 may operate in a full tracking quasi-type-II mode of operation wherein the tracking voltage 116 provides for full control of the frequency of the PLL output signal 102. In this example, X may take on non-integer values. It will be appreciated that, in such cases, this will provide different levels of tuning between the two extreme cases of setting X equal to either zero or one. It will be appreciated that the gain factors may be implemented in ways other than described herein in order to provide for adjustment of the impact of each of the tracking voltage 116 and the tuning voltage 111 on the frequency of the VCO output signal 102.

The phase detector 103 is configured to control the phase detector signal 106 that, in part, controls the VCO 101 to reduce the phase difference between the feedback signal 104 and the reference signal 105 and the tracking loop 112 is thereby configured to control the tracking voltage 116 that, in part, controls the VCO to reduce the difference between the tuning voltage 111 and the target voltage 115. In one or more embodiments, the tracking loop 112 may provide for a nullification of the difference between the tuning voltage 111 and the target voltage 115. Further, nulling the voltage difference may create a constant tuning voltage 111, a constant phase detector output duty cycle and thus a constant phase detector input phase error.

The tracking loop 112 further provides for the maintenance of a fixed phase difference between the feedback signal 104 and the reference signal 105, thereby allowing the PLL 100 to operate in a substantially similar manner to a Type II PLL when the target voltage is constant. By forcing the tuning voltage to be equal to the comparator target voltage, regardless of errors arising from the VCO 101, the phase detector average output voltage remains constant. As a consequence of the tracking loop 112, the phase detector duty-cycle remains constant, as such, the phase difference between the phase detector inputs signals remains constant. In one or more embodiments, the target voltage 115 may be a programmable voltage wherein adjustment of the target voltage 115 provides for an adjustment of the phase difference between the reference signal 105 and the feedback signal 104. Adjusting the target voltage, adjusts the tuning voltage and as such the phase detector average is adjusted and so is the phase difference between the two phase detector input signals. It will be appreciated that it may be a necessary result of the system configuration that changing the target voltage 115 will cause the phase difference between the reference signal 105 and the feedback signal 104 to change because, under conditions where the target voltage 115 does not change, the phase difference between the feedback signal 104 and the reference signal 105 is fixed as a result of the tracking loop 112 and the target voltage 115.

In one or more embodiments, the first tracking loop 112 may comprise a first tracking loop switch that is configured to switchably couple and decouple the tracking loop 112 from the tuning voltage 111. In addition, or alternatively, the tracking loop 112 may comprise a second tracking loop switch configured to switchably couple and decouple the tracking loop 112 from the VCO 101. By providing for one or more switches, the tracking loop 112 can be disconnected from the rest of the analog PLL 100, thereby allowing the PLL 100 to operate in a pure Type I mode without needing to adjust the gain factors, X and 1−X, applied to the tracking and tuning voltages 116, 111. This may be a particularly simple way to provide for controllable operation of the PLL 100 and thereby provide a more flexible device. Control of the one or more tracking loop switches may be provided by a controller that forms part of the PLL 100 or by a remote controller configured to provide signalling to the one or more switches.

In one or more embodiments, the PLL 100 may comprise a pre-charge switch 120 which is configured to switchably couple the input of the low pass filter 110 to one of: the output of the phase detector 103; and a pre-charge voltage node 121 which is couplable to a pre-charge voltage. The pre-charge voltage may be derived from a source that is part of the PLL 100 or the PLL 100 may be connectable to a voltage source external to the PLL 100 in order to provide the pre-charge voltage. In one or more embodiments, the pre-charge voltage may be set by a voltage divider arrangement arranged between a first reference voltage and a second reference voltage. For example, the first reference voltage may be a supply voltage, such as VDD, and the second reference voltage may be a ground voltage. It will be appreciated that the pre-charge voltage may also be provided in one of any of a plurality of other ways. It will further be appreciated that the first reference voltage and the second reference voltage are different to each other and that both the first reference voltage and the second reference voltage are different to the reference signal 105 of the phase detector 103.

When the pre-charge switch 120 is coupled to the pre-charge voltage via the pre-charge voltage node 121, the provision of the pre-charge voltage to the VCO 101 via the low pass filter 110 is configured to cause the VCO 101 to approach the target frequency. A calibration algorithm may be used when the VCO 101 is coupled to the pre-charge voltage node 121 in order to set the open loop VCO frequency to be as close as possible to the desired output frequency. Once the loop is closed by connecting the pre-charge switch 120 to the output of the phase detector 103, the loops of the PLL 100 will work to correct the frequency error residue of the VCO calibration. This may provide a means to set the target frequency prior to the feedback loop (comprising at least the phase detector 103 and the low pass filter 110) and/or the tracking loop 112 taking over to lock the output frequency to the set target frequency. In one or more alternate embodiments, one or more other means may be used to set the target frequency of the VCO 101.

In one or more embodiments, the target voltage 115 of the tracking loop 112 may be equal to the pre-charge voltage. Further, in some embodiments, the target voltage 115 and the pre-charge voltage may be derived from the same source, such as from a voltage divider arrangement between a first reference voltage a second reference voltage.

A reference node or the first or second reference voltage referred to herein may comprise a ground node set to a relative 0 volts or another relative voltage. It will further be appreciated that, typically, reference nodes, such as a ground node, are only considered coupled to ground when the PLL 100 is coupled to a power source. As such, references to terminals or nodes being couplable to ground or configured to be coupled to ground are understood by the skilled person as being a clear reference that such a PLL does not need to be coupled to a power source to be a PLL 100 according to the present disclosure but is configured to be so coupled in use.

Figure 2:
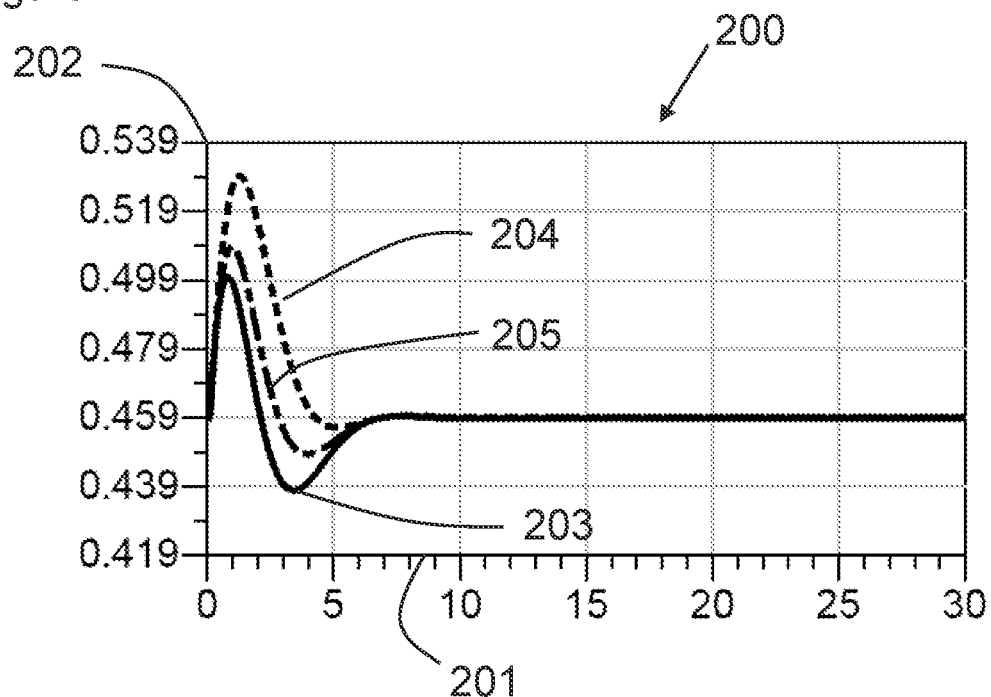
FIG. 2 shows example simulated data showing how the tuning voltage, tracking voltage and weighted sum of the tuning and tracking voltages vary over time during locking of the PLL in the case of no VCO error.

FIG. 2 shows example simulated data 200 showing how the tuning voltage 203, the tracking voltage 204 and a weighted sum 205 of the tuning and tracking voltages vary over time during the start-up of a PLL according to the present disclosure in the case of no initial VCO frequency error. The embodiment that produces the results of FIG. 2 uses a PIC in the tracking loop. In this figure, the x-axis, 201 represents time measured in microseconds and the y-axis 202 measures voltage in Volts. It can be seen that the tuning voltage 203 and the tracking voltage 204 together provide a weighted combined signal 205 on which the PLL output signal is based. The voltage of each signal 203, 204, 205 converged after approximately 8 microseconds to a voltage of 460 mV.

Figure 3:
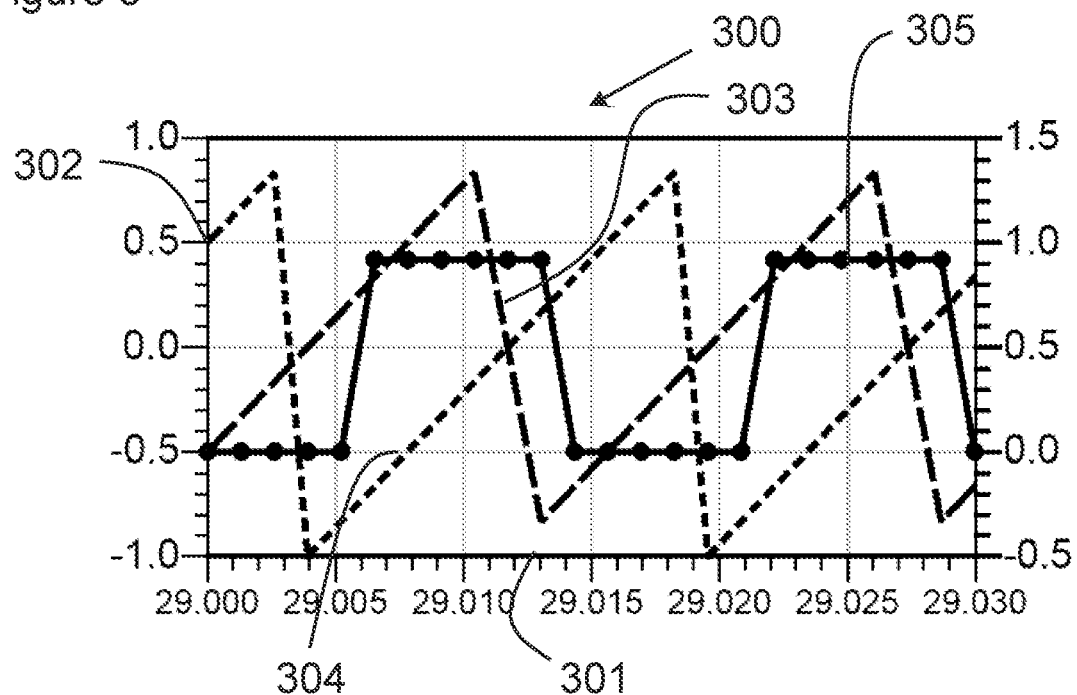
FIG. 3 example simulated data showing how the phase detector signal varies over time in response to the feedback voltage and the reference voltage in the case of no VCO error.

FIG. 3 shows example simulated data 300 showing how the reference signal 303 normalized phase, the feedback signal 304 normalized phase and the phase detector output signal 305 vary over time in the case of no initial VCO frequency error under lock conditions. In this figure, the x-axis, 301 represents time measured in microseconds and the y-axis 302 measures voltage in Volts for the Phase Detector output signal and measures the normalized phase of both reference and feedback signals at phase detector inputs. The normalised phase value of 1 represents 180 degrees and the normalised phase value of −1 represents −180 degrees. It can be seen in this case that the feedback signal 304 and the reference 303 are out of phase by 180 degrees, as such, the duty cycle of the phase detector signal 305 is 50%.

FIG. 4 shows example simulated data 400 showing how the tuning voltage 403, the tracking voltage 404 and a weighted sum 405 of the tuning and tracking voltages vary over time during the start-up of a PLL according to the present disclosure in the case where an initial VCO frequency error is present. The embodiment that produces the results of FIG. 4 uses a PIC in the tracking loop. In this figure, the x-axis, 401 represents time measured in microseconds and the y-axis 402 measures voltage in Volts. It can be seen that the tuning voltage 403 and the tracking voltage 404 together provide a weighted combined signal 405 on which the PLL output signal is based. As can be seen, the tuning voltage converges after around 5 microseconds at a voltage of around 460 mV, as was the case for the case with no initial VCO frequency error. This allows the phase detector signal to maintain a 50% duty cycle, as can be seen in FIG. 5. In order to account for the VCO error, then, the tracking voltage increases and stabilises around 830 mV thereby providing a weighted sum at around 550 mV that produces the desired output frequency despite the VCO error.

FIG. 5 shows example simulated data 500 showing how the reference signal 503 normalized phase, the feedback signal 504 normalized phase and the phase detector output signal 505 vary over time in the presence of an initial VCO frequency error under lock conditions. In this figure, the x-axis, 501 represents time measured in microseconds and the y-axis 502 measures voltage in Volts for the Phase detector output signal and measures the normalized phase of both reference and feedback signals at phase detector inputs. It can be seen in this case that the feedback signal 504 and the reference 503 are out of phase by 180 degrees despite the VCO error, as such, the duty cycle of the phase detector signal 505 is 50%.

The analog PLL 100 of the present disclosure may be particularly advantageous in systems that require coherence between different signal generators by providing for a way to compensate for bias or other frequency errors in an analog PLL. The analog PLL 100 of the present disclosure may further be used in a system where two PLLs having the same nominal output frequency are connected to the same reference clock in which it is desirable to generate a phase relationship between the PLL output signals 102.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. An analog phase locked loop (PLL) comprising:
    a voltage controlled oscillator, VCO, configured to provide, at a PLL output, a PLL output signal comprising an alternating current, AC, signal;
    a phase detector coupled to the output of the VCO, the phase detector configured to receive a feedback signal at a first phase detector input and a reference signal at a second phase detector input,
    wherein the feedback signal is based on the PLL output signal and
    wherein the phase detector is configured to provide a phase detector signal at an output of the phase detector based on a determination of a phase difference between the feedback signal and the reference signal;
    a low pass filter configured to receive the phase detector signal from the phase detector, the low pass filter configured to provide for filtering of the phase detector signal and provide the filtered signal as an output,
    wherein said output of the low pass filter is a tuning voltage for the VCO; and
    a tracking loop configured to receive the tuning voltage at an input of the tracking loop and comprising at least a tracking loop comparator configured to provide a comparator output voltage based on a difference between the tuning voltage and a target voltage,
    wherein an output of the tracking loop provides a tracking voltage based on the comparator output voltage and
    wherein a frequency of the PLL output voltage is based on the tuning voltage and the tracking voltage; and
    wherein both the VCO and the tracking loop input a same voltage value of the tuning voltage, from the low pass filter.

2. The analog PLL of claim 1:
wherein the tracking loop further comprises an integrator configured to receive the comparator output voltage at an input of the integrator and provide a non-zero output signal both where there is a difference between the tuning and target voltages received at the inputs of the tracking loop comparator and where there is no difference between the tuning and target voltages received at the inputs of the tracking loop comparator.

3. The analog PLL of claim 1:
wherein the tracking loop comprises a proportional integral controller, PIC, configured to receive the comparator output voltage at an input of an integrator and provide a non-zero PIC output signal both where there is a difference between the tuning and target voltages received at the inputs of the tracking loop comparator and where there is no difference between the tuning and target voltages received at the inputs of the tracking loop comparator, wherein the tracking voltage is based on the PIC output signal.

4. The analog PLL of claim 1:
wherein the tracking loop comprises a proportional integral derivative controller, PIDC, configured to receive the comparator output voltage an input of an integrator and provide a non-zero PIDC output signal both where there is a difference between the tuning and target voltages received at the inputs of the tracking loop comparator and where there is no difference between the tuning and target voltages received at the inputs of the tracking loop comparator,
wherein the tracking voltage is based on the time-averaged PIDC output signal.

5. The analog PLL of claim 1:
wherein the tracking loop comparator is an analog tracking loop comparator configured to provide an analog comparator output signal to a digital controller, the digital controller comprising an integrator and the digital controller configured to provide a digital controller output signal to a digital to analog converter configured to convert the digital controller output signal to an analog signal, wherein the analog signal is the tracking voltage.

6. The analog PLL of claim 1
wherein the target voltage is a programmable voltage and wherein adjustment of the target voltage provides for adjustment of the phase difference between the reference signal and the feedback signal.

7. The analog PLL of claim 1
wherein the VCO comprises a tuning input configured to receive the tuning voltage and a tracking input configured to receive the tracking voltage.

8. The analog PLL of claim 7
wherein the VCO is configured to apply a tracking gain to the received tracking voltage and the VCO is configured to apply a tuning gain to the tuning voltage and wherein the tracking gain is related to the tuning gain such that, if the tracking gain is equal to a factor $K_{VCO}*X$, then the tuning gain is equal to a factor of $K_{VCO}*(1-X)$ where $0 \leq X \leq 1$ and where $K_{VCO}$ is a scaling constant real number expressed in Hz/V.

9. The analog PLL of claim 1
wherein the phase locked loop further comprises a summing element configured to receive the tracking voltage at a first summing input and the tuning voltage at a second summing input,
wherein the summing element comprises a summing output configured to provide a summed output signal based on the sum of the tracking voltage and the tuning voltage and wherein the frequency of the PLL output signal of the VCO is based on the summed output signal.

10. The analog PLL of claim 9
wherein the summing element is configured to apply the tracking gain to the received tracking voltage and the summing element is configured to apply the tuning gain to the tuning voltage and
wherein the tracking gain is related to the tuning gain such that, if the tracking gain is equal to a factor X, then the tuning gain is equal to a factor of $1-X$ where $0 \leq X \leq 1$.

11. The analog PLL of claim 1 wherein the tracking loop comprises one or both of:
a first tracking loop switch configured to switchably couple and decouple the tracking loop from the tuning voltage; and
a second tracking loop switch configured to switchably couple and decouple the tracking loop from the VCO.

12. The analog PLL of claim 1 further comprising
a feedback divider coupled to the output of the VCO,
wherein the frequency divider is configured to receive the PLL output signal at an input of the feedback divider and to provide the feedback signal at an output of the feedback divider which has a frequency equal to the frequency of the PLL output signal divided by a number greater than 1.

13. The analog PLL of claim 1 further comprising
a pre-charge switch which is configured to switchably couple the input of the low pass filter to one of:
the output of the phase detector; and
a pre-charge voltage node couplable to a pre-charge voltage wherein, when the pre-charge switch is coupled to the pre-charge voltage via the pre-charge voltage node, the provision of the pre-charge voltage to the VCO via the low pass filter causes the VCO to approach a target frequency.

14. The analog PLL of claim 13:
wherein the pre-charge voltage is equal to the target voltage of the tracking loop.

15. The analog PLL of claim 13:
wherein the pre-charge voltage and the target voltage are set by a voltage divider arrangement arranged between a first reference voltage and a second reference voltage.

16. An analog phase locked loop (PLL) comprising:
a voltage controlled oscillator, VCO, configured to provide, at a PLL output, a PLL output signal comprising an alternating current, AC, signal;
a phase detector coupled to the output of the VCO, the phase detector configured to receive a feedback signal at a first phase detector input and a reference signal at a second phase detector input,
wherein the feedback signal is based on the PLL output signal and
wherein the phase detector is configured to provide a phase detector signal at an output of the phase detector based on a determination of a phase difference between the feedback signal and the reference signal;
a low pass filter configured to receive the phase detector signal from the phase detector, the low pass filter configured to provide for filtering of the phase detector signal and provide the filtered signal as an output,
wherein said output of the low pass filter is a tuning voltage for the VCO; and
a tracking loop configured to receive the tuning voltage at an input of the tracking loop and comprising at least a tracking loop comparator configured to provide a comparator output voltage based on a difference between the tuning voltage and a target voltage, wherein an output of the tracking loop provides a tracking voltage based on the comparator output voltage and wherein a frequency of the PLL output voltage is based on the tuning voltage and the tracking voltage; and wherein the tracking loop comparator is an analog tracking loop comparator configured to provide an analog comparator output signal to a digital controller, the digital controller comprising an integrator and the digital controller configured to provide a digital controller output signal to a digital to analog converter configured to convert the digital controller output signal to an analog signal, wherein the analog signal is the tracking voltage.

17. An analog phase locked loop (PLL) comprising:

a voltage controlled oscillator, VCO, configured to provide, at a PLL output, a PLL output signal comprising an alternating current, AC, signal;

a phase detector coupled to the output of the VCO, the phase detector configured to receive a feedback signal at a first phase detector input and a reference signal at a second phase detector input, wherein the feedback signal is based on the PLL output signal and wherein the phase detector is configured to provide a phase detector signal at an output of the phase detector based on a determination of a phase difference between the feedback signal and the reference signal;

a low pass filter configured to receive the phase detector signal from the phase detector, the low pass filter configured to provide for filtering of the phase detector signal and provide the filtered signal as an output, wherein said output of the low pass filter is a tuning voltage for the VCO; and a tracking loop configured to receive the tuning voltage at an input of the tracking loop and comprising at least a tracking loop comparator configured to provide a comparator output voltage based on a difference between the tuning voltage and a target voltage, wherein an output of the tracking loop provides a tracking voltage based on the comparator output voltage and wherein a frequency of the PLL output voltage is based on the tuning voltage and the tracking voltage; and wherein the tracking loop further comprises an integrator configured to receive the comparator output voltage at an input of the integrator and provide a non-zero output signal both where there is a difference between the tuning and target voltages received at the inputs of the tracking loop comparator and where there is no difference between the tuning and target voltages received at the inputs of the tracking loop comparator.

* * * * *